United States Patent [19]

Riedel

[11] Patent Number: 4,910,512
[45] Date of Patent: Mar. 20, 1990

[54] MONITORING EQUIPMENT FOR THE SAFETY DEVICES USED IN VEHICLES WHEN DRIVING IN REVERSE

[75] Inventor: Hans-Dieter Riedel, Erlangen, Fed. Rep. of Germany

[73] Assignee: Siemens Aktiengesellschaft, Berlin & Munich, Fed. Rep. of Germany

[21] Appl. No.: 259,925

[22] Filed: Oct. 19, 1988

[30] Foreign Application Priority Data

Oct. 19, 1987 [DE] Fed. Rep. of Germany ....... 3735344

[51] Int. Cl.4 .............................................. G08G 1/00
[52] U.S. Cl. .................................... 340/943; 340/901; 340/904; 367/909
[58] Field of Search ............... 340/901, 903, 904, 943, 340/52 H; 364/461; 367/909; 180/169

[56] References Cited

U.S. PATENT DOCUMENTS

| 2,521,683 | 9/1950 | Barker | 340/943 |
|---|---|---|---|
| 3,675,190 | 7/1972 | Auer, Jr. et al. | 340/943 |
| 3,881,805 | 5/1975 | Larson, III . | |
| 3,922,629 | 11/1975 | Hayakawa | 340/904 |
| 3,975,698 | 8/1976 | Redman . | |
| 4,240,152 | 12/1980 | Duncan et al. | 340/904 |
| 4,528,563 | 7/1985 | Takeuchi | 340/943 |
| 4,542,489 | 9/1985 | Naruse . | |
| 4,561,064 | 12/1985 | Brüggen et al. | 340/904 |
| 4,625,829 | 12/1986 | Sirois . | |
| 4,636,997 | 1/1987 | Toyama et al. | 340/904 |
| 4,674,073 | 6/1987 | Naruse | 340/904 |

FOREIGN PATENT DOCUMENTS

| 1805834 | 6/1969 | Fed. Rep. of Germany . |
| 3207950 | 9/1983 | Fed. Rep. of Germany . |
| 3420004 | 12/1985 | Fed. Rep. of Germany . |
| 58-80574 | 5/1983 | Japan . |

OTHER PUBLICATIONS

European Search Report: RS 79907 DE, 10-15-87.
Electronik, vol. 35, No. 22 (1986), Oct.
Patent Abstracts of Japan, vol. 10, No. 195, Jul. 9, 1986 JP-A-61 38 479.

Primary Examiner—Joseph A. Orsino
Assistant Examiner—Brent A. Swarthout
Attorney, Agent, or Firm—Kenyon & Kenyon

[57] ABSTRACT

A monitoring apparatus for a safety device for driving a vehicle in reverse comprising at least two transmitter/receiver pairs which are mounted at the back of the vehicle and which operate by reflecting sound. Each transmitter/receiver is associated with an electroacoustic transducer. An acoustic shunt is positioned between neighboring transducers. The transmitter/receiver pairs alternate cyclically to acquire an object. The signal received from a neighboring transmitter is evaluated as a function control signal.

19 Claims, 4 Drawing Sheets

MONITORING EQUIPMENT FOR THE SAFETY DEVICES USED IN VEHICLES WHEN DRIVING IN REVERSE

BACKGROUND OF THE INVENTION

The present invention relates to monitoring equipment for the safety devices used in vehicles when driving in reverse which comprise at least two transmitter/receiver pairs that are mounted on the back of the vehicle. The monitoring equipment operates by reflecting sound off any nearby object using a known method that is also referred to as echo sounding. Each transmitter/receiver pair is coordinated with an electroacoustic transducer.

Safety devices for driving a vehicle in reverse, such as these mentioned above, are known from the journal "Elektronik" 22, 10/31/1986, pages 48 and 50. In these sonic warning devices, automatic test programs indicate a malfunction of the electronic evaluation circuit. These programs, however, cannot detect faulty operation of the safety device that is caused by environmental conditions that act upon the sensors, i.e., the electroacoustic transducers. Thus, the present invention uses simple monitoring equipment to indicate whether the foregoing kind of safety device for driving a vehicle in reverse malfunctions during operation and whether the malfunction is caused by component failure or by soiling, wetting, icing, etc. of the transducers.

SUMMARY OF THE INVENTION

The present invention solves the foregoing problem by cyclically alternating the transmitter/receiver pairs to acquire the object, providing an acoustic shunt between neighboring transducers to shunt sound from the transducer that is active to the one that is not, and by evaluating the signal received at the neighboring transducer as a function control signal. Accordingly, the present invention uses part of the acoustic power radiated by the transmitter of one transmitter/receiver pair and the receiver of another transmitter/receiver pair that is not used for object acquisition to produce the function control signal that is subsequently evaluated. Complete function control of the warning device is thus achieved.

DETAILED DESCRIPTION

Figure 1:
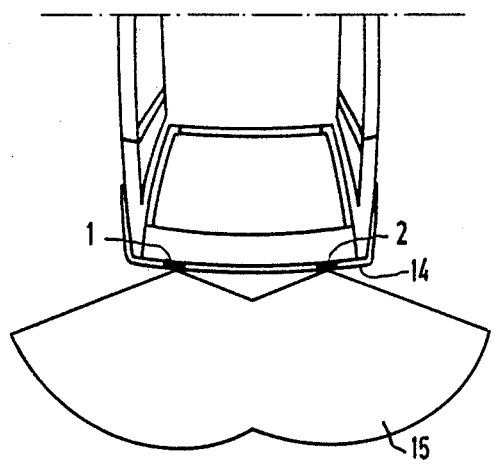
FIG. 1 shows an arrangement of electroacoustic transducers at the back of a vehicle.

FIG. 1 shows a known arrangement of two electroacoustic transducers 1 and 2 on the rear bumper 14 of a motor vehicle. Any object located in the acquisition zone 15, shown with shading in FIG. 1, reflects part of the sound emitted by the electroacoustic transducers back to the transducers. The reflected sound is recognized as an obstruction. The distance between the object and the back of the vehicle is determined from the time delay between the emission of the sound and the arrival of the echo.

Figure 2:
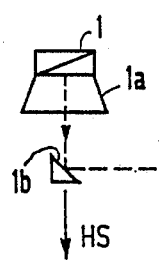
FIG. 2, 3, 4A and 4B show four embodiments of the acoustic shunt.
Figure 2:
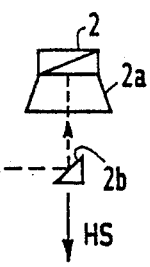

FIG. 2 illustrates one possibility for obtaining an acoustic shunt between two transducers, i.e., for deflecting part of the sound emitted by one transmitter to the receiver of the neighboring transducer. The electroacoustic transducers 1 and 2 have associated horns 1a and 2a to direct the outgoing sound. Sound reflection surfaces 1b, 2b are mounted along the center axis of the main sound direction of each transducer as indicated by arrow HS. The reflection surfaces are inclined at 45 degrees to the main sound direction HS. The reflection surfaces comprise, for example, parts that are shaped as prisms. When the transmitter associated with acoustic transducer 1 is activated, a part of the sound emitted by it can be deflected by sound reflection surface 1b. The deflected sound is reorientated by the sound reflection surface 2b associated with electroacoustic transducer 2 towards the receiver associated with transducer 2.

The transmitters associated with transducers 1 and 2 never operate at the same time but rather cyclically alternate. While the transmitter associated with transducer 1 acquires an object, it can also be used to check the operability of transducer 2. Likewise, the operability of the receiver associated with transducer 1 can be determined when the transmitter associated with transducer 2 is active. A reciprocal check of the transmitter/receiver functions between neighboring transducers takes place in this manner.

Figure 3:
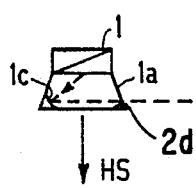
Figure 3:
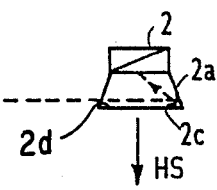

FIG. 3 shows an alternate embodiment of the invention in which the sound deflection, i.e., the realization of the acoustic shunt, is accomplished using concave reflecting surfaces 1c and 2c which are mounted to the inside wall of the horns 1a, 2a, respectively. The horns 1a and 2a have holes 1d and 2d for the sound to enter opposite the reflection surfaces 1c and 2c. Again, the sound is deflected perpendicular to the main sound direction HS.

Figure 4A:
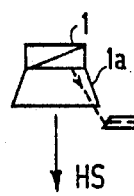
Figure 4A:
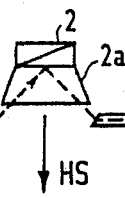
Figure 4A:
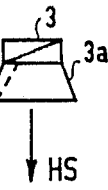

If the acquisition zone is to be located in the immediate vicinity of the rear bumper and extend over its entire length, then three or more electroacoustic transducers can be mounted to the bumper and separated by equal distances. FIG. 4A shows such an alternate embodiment. The acoustic shunt is obtained using pipes 16 in which each pipe is positioned between two neighboring transducers. The pipes advantageously have smooth inner walls and comprise a hard material such as metal or plastic to ensure good sound conduction. It is possible to bevel the ends of each tube as shown in FIG. 4A. Alternately, the ends of the pipes can flare out in the shape of a funnel to catch as much as possible of the sound emitted by the respective transmitter as shown in FIG. 4B.

Figure 5:
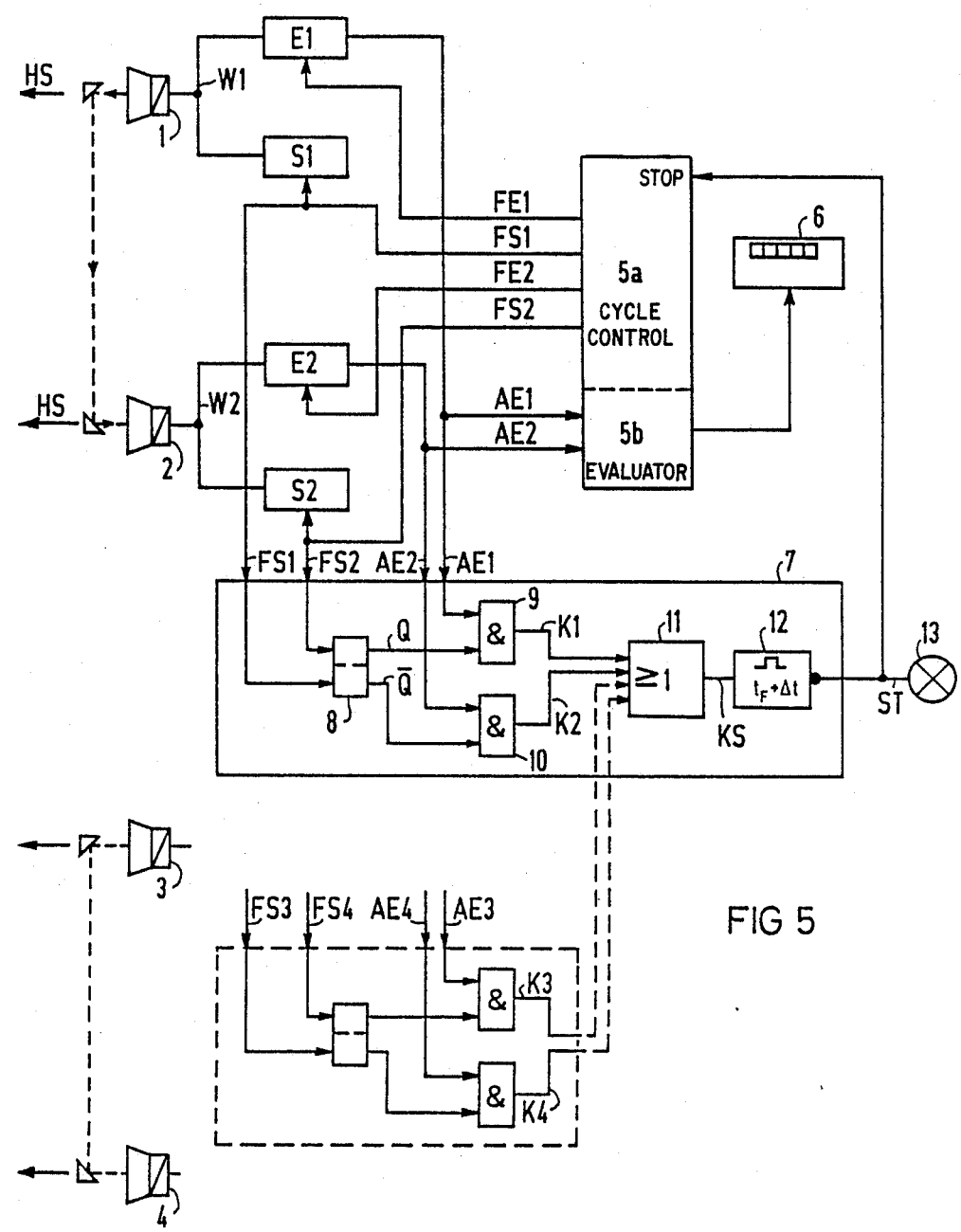
FIG. 5 shows a block diagram of the monitoring equipment for a safety device used for driving a vehicle in reverse.

FIG. 5 shows a means for evaluating the control signals generated using the acoustic shunt of the present invention. The upper part of FIG. 5 shows a typical design for a safety device for driving a vehicle in reverse using two electroacoustic transducers 1 and 2. Associated with each transducer is a transmitter/receiver pair comprising receivers E1, E2 and transmitters S1, S2. The transmitters S1, S2 contain high-frequency oscillators, the output voltage of which is briefly connected to the electroacoustic transducers 1, 2 using the enabling signals FS1 and FS2, respectively, of a cycling controller 5a. The cycling controller 5 also causes enabling signals FE1 and FE2 to feed output signals AE1 and AE2 of the receivers E1 and E2, respectively, to a test signal evaluator 5b. The output signals AE1, AE2 can be released so that a short circuit in the input of the respective receiver is canceled by an enabling signal FE1, FE2, respectively. To avoid feedback, and particularly overloading of the receivers, the cycling controller 5a assures that the receivers are not released by the enable signals FE1 and FE2 when the transmitters act upon the transducers. Their inputs are effectively shorted. In the receivers E1 and E2, the high-frequency signal that is received is processed into a digitally processable pulse. For object acquisition, the transmitter/receiver pairs are controlled in alternating cycles in such a manner that the receiver E1 is released after a brief release of transmitter S1. The transmitter S2 is briefly released after a certain time $t_F$. Subsequently, receiver E2 is also released. After time $t_F$ has elapsed since the release of transmitter S1, the evaluating circuit 5b determines the distance between the object and the back of the vehicle. A display 6 displays the distance based on the time delay between the emission of the sound and the reception of the sound reflected by the object.

The monitoring device 7 shown in FIG. 5 equips two transducers 1 and 2 with an acoustic shunt comprising a bistable flip-flop 8 whose input receives the transmitter release signals FS1 and FS2, respectively. The output signals Q and $\overline{Q}$ of the bistable flip-flop are fed to two AND gates 9 and 10. The other inputs of these AND gates receive the output signals AE1 and AE2 from receivers E1 and E2. These AND gates represent electronic gate circuits which pass a signal received from the neighboring transmitter whenever the transmitter is not released in the next test cycle. Consequently, if the receiver E1 is operational, the control signal K1 appears at the output of AND gate 9 between the release of transmitter S2 and the subsequent release of transmitter S1. If the receiver E2 is operational, the control signal K2 appears in response to the sound emitted by the transmitter S1. To form a combined control signal KS, the control signals K1 and K2 are fed to an OR gate 11. The output of gate 11 acts upon a retriggerable multivibrator 12 that has a sweep time $t_F + \Delta t$. The variable $t_F$ is the time interval in which the releases of the transmitters S1 and S2 cyclically follow each other. A retriggerable sweep is restarted with each change of the signal from an L to an H that appears at its input. In effect, the output signal retains the H signal if one pulse is followed by another within a time interval that is shorter than its sweep time. Therefore, if the control signals K1 and K2 appear in regular sequence during the operation of the safety device for driving in reverse, the inverted output signal ST of the retriggerable multivibrator 12 remains an L signal. If the K1 or K2 control signals do not appear, the ST signal is an L signal and lights a display lamp 13. It is advantageous if the cycling control 5a immediately stops the malfunction report signal ST to provide an opportunity to locate the error.

Figure 4B:
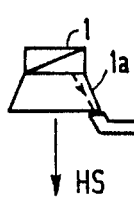
Figure 4B:
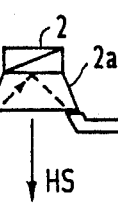

To accommodate the three electroacoustic transducers shown in FIGS. 4A or 4B the monitoring device 7 must be modified as shown by the dotted lines in FIG. 5. The modification comprises an AND-gate that has three inputs. The third input is connected to the output signal AE3 from the receiver associated with the third electroacoustic transducer. The output of an OR-gate is connected to the second input to which are fed the release signal FS3 of the transmitter associated with the third electroacoustic transducer. The orderly transmission of the central electroacoustic transducer 2 is simultaneously monitored by its two neighboring electroacoustic transducers. The receiver signals AE1 and AE3 act in conjunction to effect the control signal K1. The electroacoustic transducer 2 monitors the orderly transmission of its neighboring electroacoustic transducers and generates the control signal K2 at the output of the AND-gate 10.

The lower part of FIG. 5 shows how the monitoring device 7 of the present invention is supplemented when additional transducers are employed. For two transducers, such as 4 and 5, one bistable flip-flop and two AND-gates should be provided. These circuit components would be connected to the transmitter release signals FS4 and FS5 and the output signals AE4, AE5 of the corresponding receivers. The corresponding control signals K4, K5 then also connect to the OR-gate 11 to form the combined control signal KS.

One having ordinary skill in the art can readily modify the monitoring device shown in FIG. 5 for use with any desired number of electroacoustic transducers. An even number of transducers would be arranged in pairs as shown in FIGS. 2 or 3. An odd number of transducers, such as three, would use an embodiment shown with the dotted line connected to monitor device 7. Transducer pairs are again used for the remaining transducers as shown on the lower part of FIG. 5.

Figure 6:
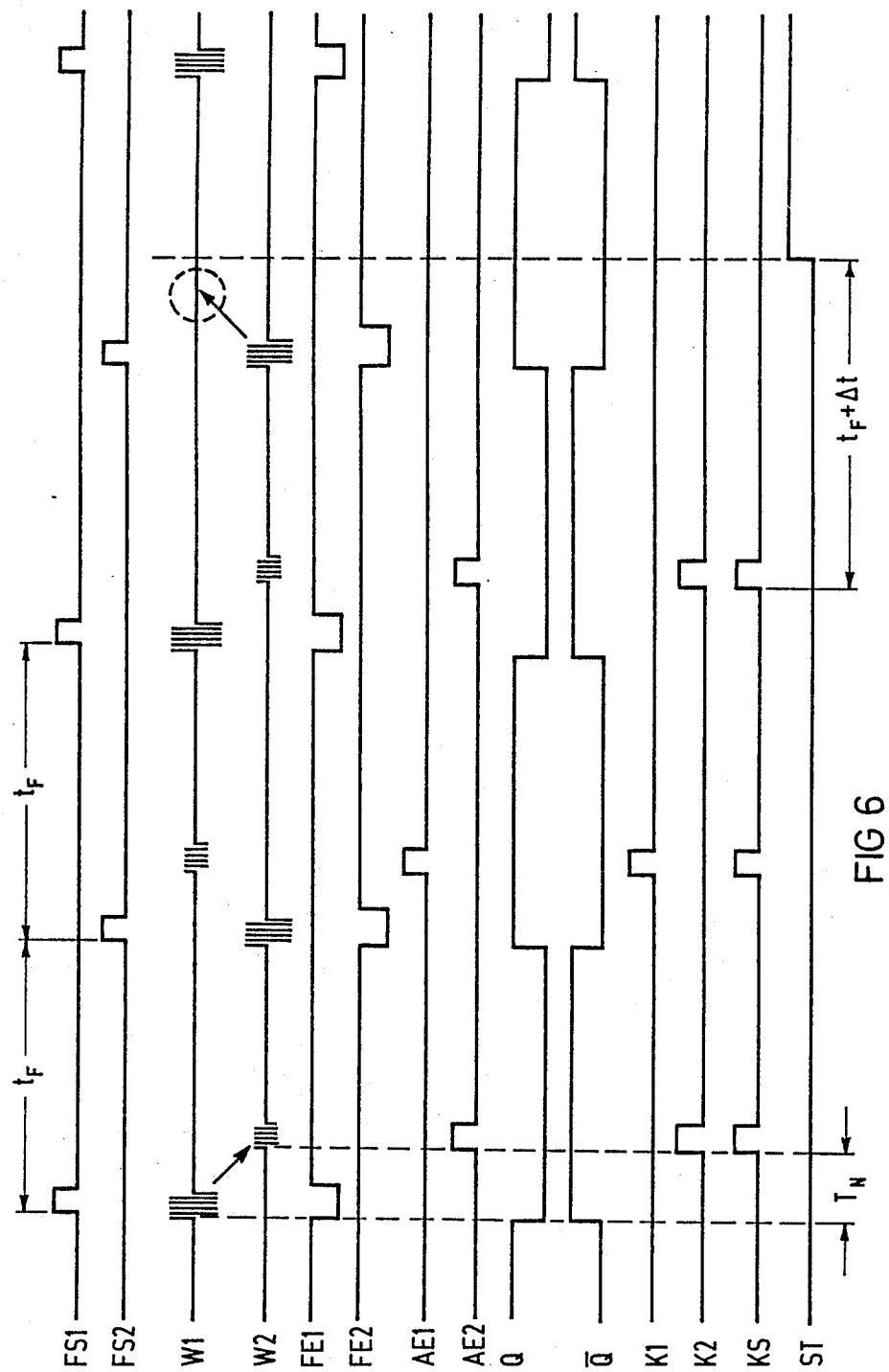
FIG. 6 shows timing diagrams associated with the monitoring equipment shown in FIG. 5.

FIG. 6 shows a timing diagram for the signals occurring in the embodiment shown in FIG. 5 when no object is in the acquisition zone of the transducers. The enabling signals FS1 and FS2 for transmitters S1 and S2 follow each other in the time interval $t_F$. A brief, high-frequency voltage signal W1 or W2, also called a "burst", can be applied to the transducers 1 or 2 during this time interval. The burst signal is received by the neighboring transducer after a relatively short transit time through the shunt. The receipt of a burst signal leads to a digital signal AE1 or AE2 which, in conjunction with the signals Q and $\overline{Q}$, leads to the control signals K1 and K2. These control signals are combined by the OR gate to produce the KS signal. The combination of the AND linkage of the AE1 and AE2 signals to the output signals Q and $\overline{Q}$ of the bistable flip-flop is essential. Otherwise, a signal could be emitted by the transmitter S1, reflected by an object, received by the associated receiver E1, and give the safety device the appearance of operating by generating a control pulse K1 when the receiver E2 has failed.

The right part of the timing diagram of FIG. 6 shows a malfunction in which no signal is received after release of the transmitter S2 due to a failure of the receiver E1 associated with the neighboring transducer. As a result, there is no control pulse K1 during the sweep time $t_F + \Delta t$ of the retriggerable multivibrator 12. Therefore, the output signal of the multivibrator 12 becomes an L signal and the malfunction report signal ST becomes an H signal which indicates the malfunction and stops the cycling controller. FIG. 6 also shows that t must be shorter than the time interval $t_F$ for successive releases of the transmitter.

Figure 7:
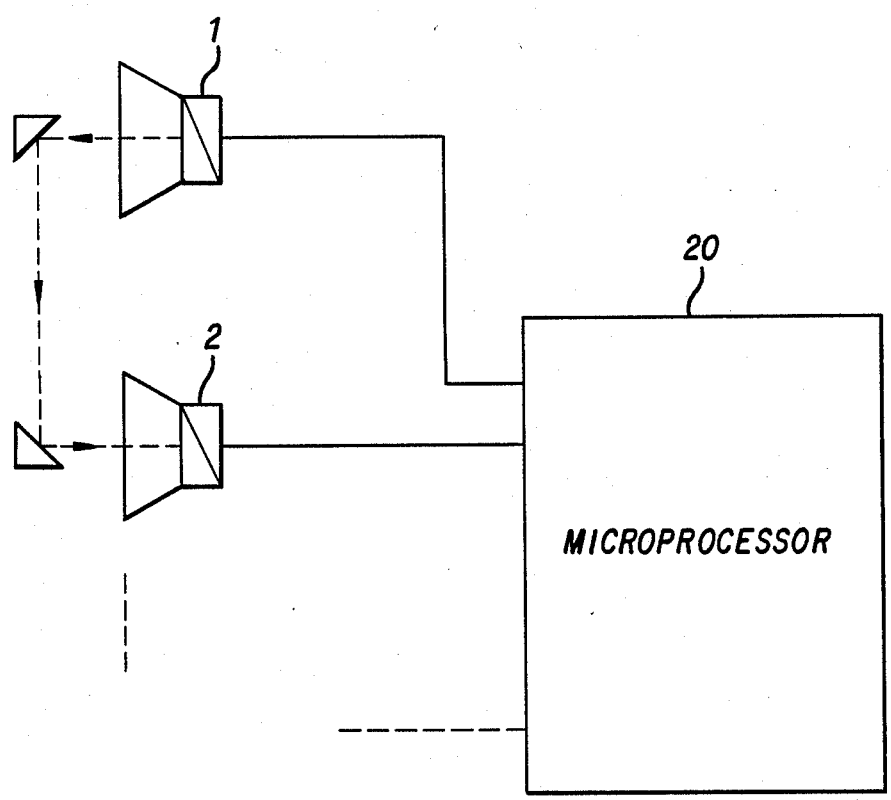
FIG. 7 shows a microprocessor connected to an arrangement of transducer.

The functions of the cycling control 5a, test signal evaluator 5b and monitoring device 7 can also be performed using a microprocessor that executes an appropriate program. The microprocessor is labeled as 20 in the block diagram shown in FIG. 7. The program for the microprocessor can implement the logic functions shown in FIG. 5. Generating such a program is considered within the level of skill of one having ordinary skill in the art and will not be described further. This embodiment may have particular advantage for controlling more than two transducers as shown in FIGS. 4A and 4B.

It is further noted that changes in sound propagation times caused by changing atmospheric conditions such as barometric pressure and relative humidity are easily accommodated. The length of the shunt path used in the present invention is constant so that the corresponding measured signal transit time, designated $T_n$ in FIG. 6, can be used as the comparison standard for acquiring the object, i.e., for calculating the distance between the bumper and the object. This approach is thus extremely accurate for approaching, for example, a loading ramp under different environmental conditions.

What is claimed:

1. A monitoring apparatus for a safety device for driving a vehicle in reverse, comprising:
    at least two neighboring transmitter/receiver pairs mounted on a back of a vehicle to measure a distance to an object by reflecting sound off the object, the reflected sound forming an echo, each neighboring transmitter/receiver pair having an associated electro-acoustic transducer;
    means for operating the transmitter/receiver pairs in cyclical alternation to acquire an object by having one transmitter/receiver generate a sound signal and the other transmitter/receiver generate a receiver signal in response to the sound signal;
    an acoustic shunt provided between neighboring transducers for shunting a part of the sound signal to a receiver of a neighboring transmitter/receiver; and
    means for evaluating the sound signal received by the receiver of the neighboring transmitter/receiver pair and for generating a malfunction control signal that is indicative of a malfunction.

2. An apparatus as claimed in claim 1, further comprising:
    an electronic gate circuit associated with each transducer for receiving an output signal of the receiver associated with the transducer; and
    means for controlling the gate circuit so that it conducts only during a time between operation of the transmitter associated with the neighboring transducer and operation of the transmitter associated with the transducer following next in the cyclical alternation.

3. An apparatus as claimed in claim 2, wherein the two neighboring transducers comprise a bistable flip-flop having inputs for receiving enabling signals from their two associated transmitters and for generating output signals, and further comprising two AND gates to receive the output signals of the bistable flip-flop, the AND gates being used as gate circuits, the outputs of the AND gates being connected to the outputs of the respective receivers.

4. An apparatus as claimed in claim 3, further comprising:
    an OR gate to receive outputs of the gate circuits; and
    a retriggerable multivibrator having a sweep time between one and two times a time interval corresponding to successive transmitter releases, the multivibrator generating an output signal.

5. An apparatus as claimed in claim 4, further comprising:
    means for deriving a malfunction report signal from an output of the multivibrator;
    a transmitter/receiver cycling controller; and
    means for stopping the transmitter/receiver cycling controller in response to the malfunction control signal.

6. An apparatus as claimed in claim 1, wherein the acoustic shunt comprises at least one pipe that is suited for sound conduction disposed between the neighboring transducers.

7. An apparatus as claimed in claim 6, wherein the pipe has ends that are contoured in a shape chosen from the group consisting of:
    a beveled end, and funnel.

8. An apparatus as claimed in claim 7, wherein at least one sound reflection surface is associated with each transducer to partially deflect sound in a direction perpendicular to a longitudinal axis of the vehicle.

9. An apparatus as claimed in claim 8, further comprising:
    a horn associated with each transducer; and
    means for mounting the sound reflection surface on an inside wall of each horn.

10. An apparatus as claimed in claim 8, wherein the sound reflection surface is concave.

11. An apparatus as claimed in claim 9, wherein the sound reflection surfaces is concave.

12. An apparatus as claimed in claim 1, wherein the operating means and the evaluating means comprise sections of a program that is executed by a microprocessor.

13. An apparatus as claimed in claim 12, wherein the acoustic shunt comprises at least one pipe that is suited for sound conduction disposed between neighboring transducers.

14. An apparatus as claimed in claim 13, wherein the pipe has ends that flare out in a funnel shape.

15. An apparatus as claimed in claim 13, wherein the pipe has ends that are bevelled.

16. An apparatus as claimed in claim 13, wherein at least one sound reflection surface is associated with each transducer to partially deflect sound in a direction perpendicular to a longitudinal axis of the vehicle.

17. An apparatus as claimed in claim 16, further comprising:
    a horn associated with each transducer; and
    means for mounting the sound reflection surface on an inside walls of each horn.

18. An apparatus as claimed in claim 16, wherein the sound reflection surface is concave.

19. An apparatus as claimed in claim 17, wherein the sound reflection surface is concave.

* * * * *